United States Patent
Yang et al.

(10) Patent No.: US 11,360,384 B2
(45) Date of Patent: Jun. 14, 2022

(54) METHOD OF FABRICATING AND SERVICING A PHOTOMASK

(71) Applicant: TAIWAN SEMICONDUCTOR MANUFACTURING CO., LTD., Hsinchu (TW)

(72) Inventors: Chun-Fu Yang, Hsinchu (TW); Pei-Cheng Hsu, Taipei (TW); Ta-Cheng Lien, Cyonglin Township (TW); Hsin-Chang Lee, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 448 days.

(21) Appl. No.: 16/568,028

(22) Filed: Sep. 11, 2019

(65) Prior Publication Data

US 2020/0103745 A1    Apr. 2, 2020

Related U.S. Application Data

(60) Provisional application No. 62/738,003, filed on Sep. 28, 2018.

(51) Int. Cl.
*G03F 1/82* (2012.01)
*G03F 7/20* (2006.01)

(52) U.S. Cl.
CPC .............. *G03F 1/82* (2013.01); *G03F 7/2002* (2013.01)

(58) Field of Classification Search
CPC ................................ G03F 1/82; G03F 7/2002
USPC ............................................................ 430/5
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,377,693 B2 | 6/2016 | Huang et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,625,824 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 10,459,352 B2 | 10/2019 | Chang et al. | |
| 2007/0037410 A1 | 2/2007 | Chang et al. | |
| 2008/0057411 A1 | 3/2008 | Carpenter et al. | |
| 2008/0070128 A1 | 3/2008 | Wu et al. | |
| 2012/0231378 A1 | 9/2012 | Mikami et al. | |
| 2017/0017151 A1 | 1/2017 | Matsushima et al. | |
| 2017/0060005 A1 | 3/2017 | Chang et al. | |
| 2018/0149963 A1 | 5/2018 | Hsieh et al. | |
| 2021/0063866 A1* | 3/2021 | Hamamoto | G03F 1/24 |

FOREIGN PATENT DOCUMENTS

| | | |
|---|---|---|
| CN | 107132733 A | 9/2017 |
| DE | 10 2017 211 539 A1 | 1/2019 |
| JP | 2012-256944 A | 12/2012 |
| JP | 2013-115304 A | 6/2013 |
| KR | 10-2008-0001473 A | 1/2008 |
| KR | 10-2008-0025294 A | 3/2008 |
| KR | 10-2011-0050438 A | 5/2011 |
| KR | 10-2016-0132068 A | 11/2016 |
| KR | 101976059 B1 | 5/2019 |
| TW | 201639417 A | 11/2016 |
| TW | I563348 B | 12/2016 |
| TW | I575339 B | 3/2017 |
| WO | 2009/158311 A2 | 12/2009 |
| WO | 2011/071123 A1 | 6/2011 |

* cited by examiner

*Primary Examiner* — Christopher G Young
(74) *Attorney, Agent, or Firm* — McDermott Will & Emery LLP

(57) ABSTRACT

A method includes placing a photomask having a contamination on a surface thereof in a plasma processing chamber. The contaminated photomask is plasma processed in the plasma processing chamber to remove the contamination from the surface. The plasma includes oxygen plasma or hydrogen plasma.

20 Claims, 13 Drawing Sheets

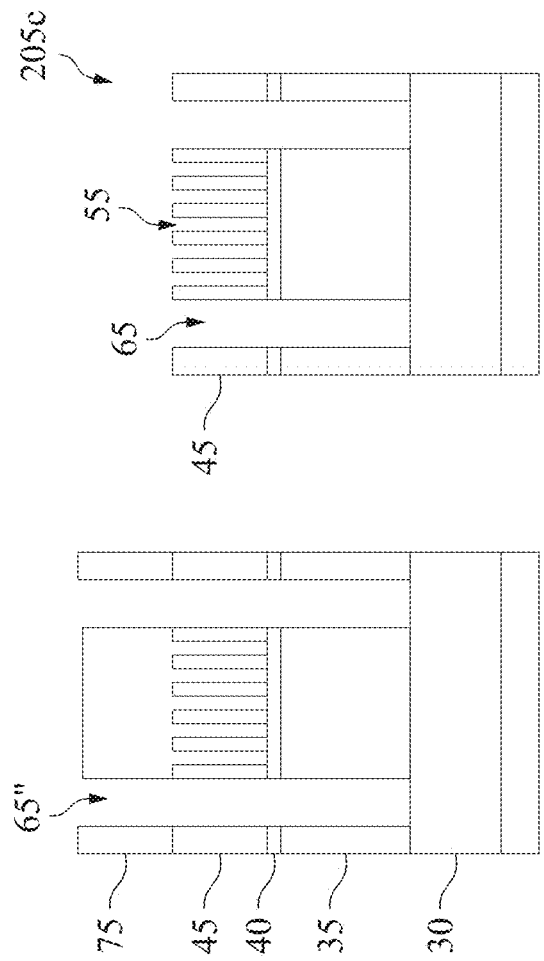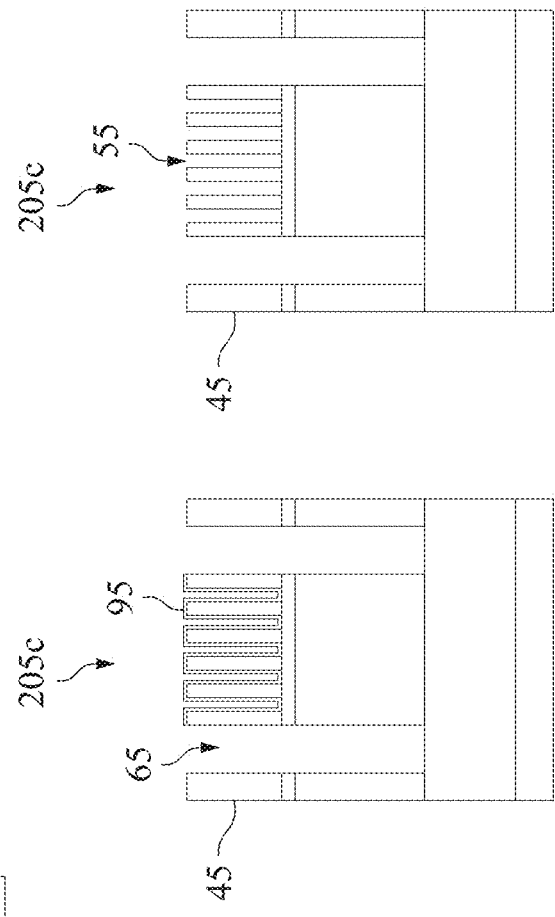

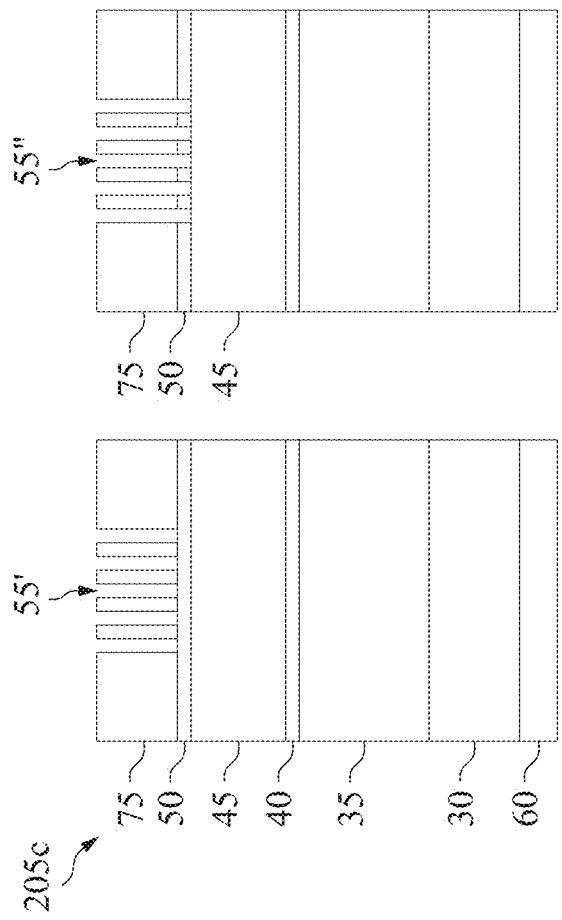
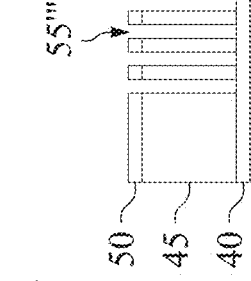
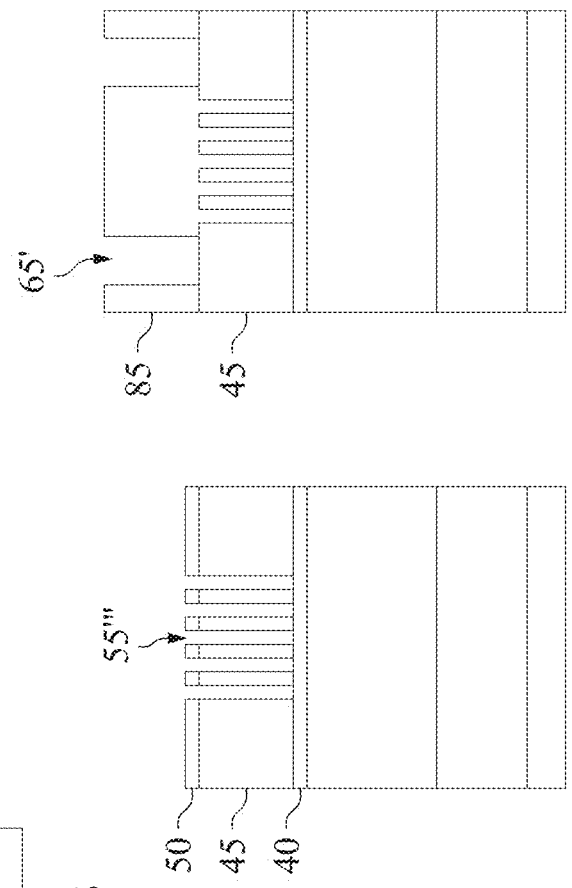
FIG. 6A
FIG. 6B
FIG. 6C
FIG. 6D

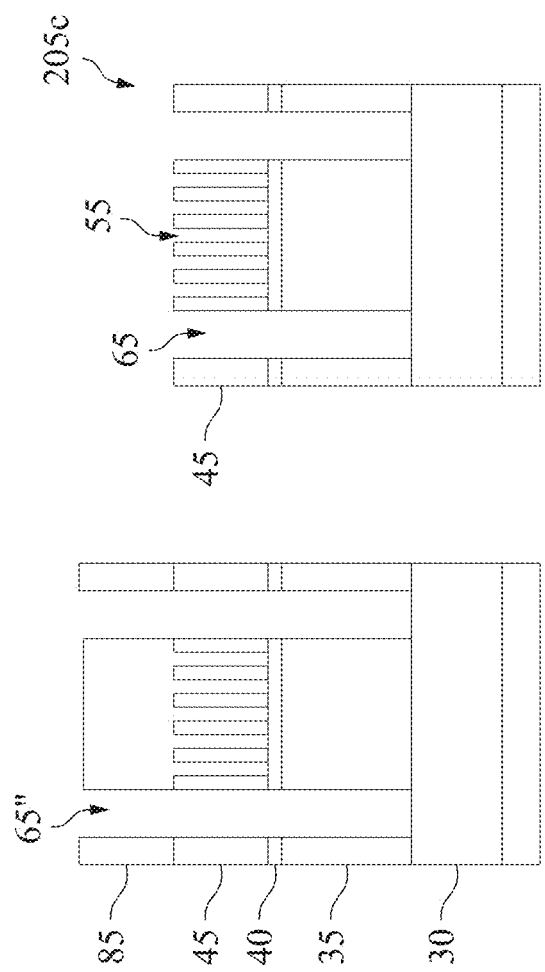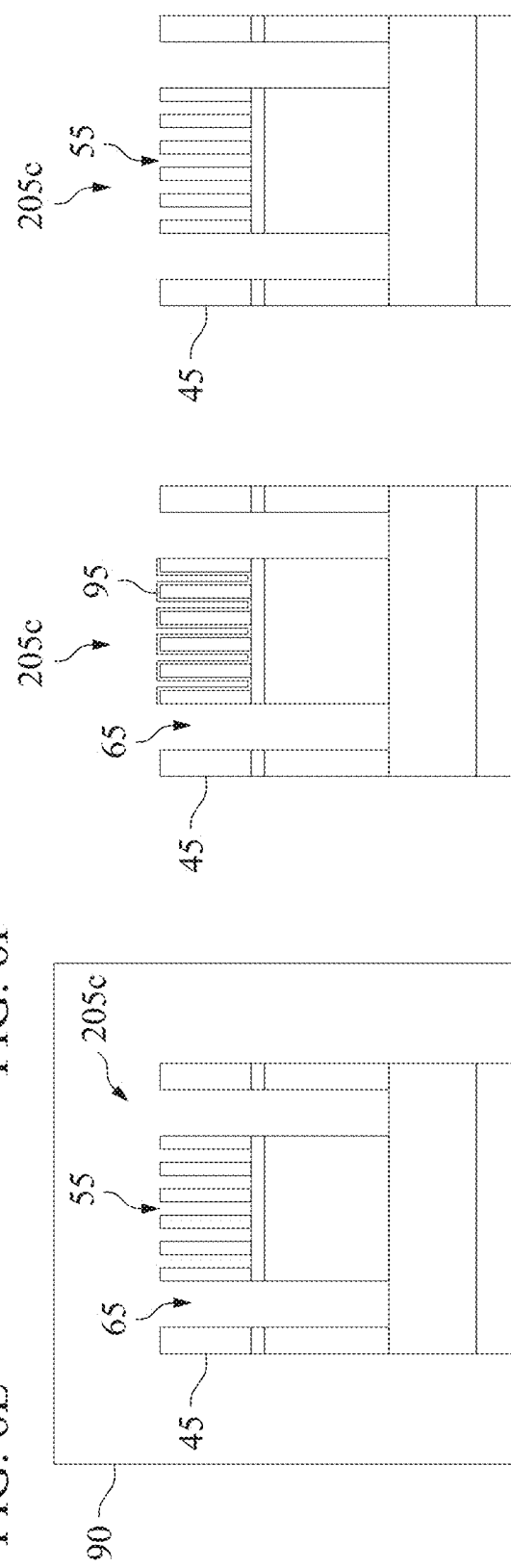

METHOD OF FABRICATING AND SERVICING A PHOTOMASK

CROSS-REFERENCE TO RELATED APPLICATIONS

This application claims priority to U.S. Provisional Patent Application No. 62/738,003 filed Sep. 28, 2018, the entire disclosure of which is incorporated herein by reference.

BACKGROUND

As the semiconductor industry has progressed into nanometer technology process nodes in pursuit of higher device density, higher performance, and lower costs, challenges from both fabrication and design issues become greater. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Photolithography operations are one of the key operations in the semiconductor manufacturing process. Photolithography techniques include ultraviolet lithography, deep ultraviolet lithography, and extreme ultraviolet lithography (EUVL). The photomask is an important component in photolithography operations. It is critical to fabricate and maintain photomasks free of resolvable defects. However, photomask fabrication techniques typically include electron beam lithography and etching operations, which can generate particles and etching residues. Further, use of the photomask during photolithographic operations can generate particle residue. For example, EUVL can generate contamination, including hydrocarbon particles during photoresist exposure operations. Heat generated during EUV exposure can cause partial decomposition and volatilization of the photoresist. The decomposed and volatilized residues can contaminate the photomask. In addition, during long term mask storage the mask can be contaminated by particles and residue. For example, Van der Waals force resulting from the high concentration of metal atoms in an EUV photomask attracts contaminant particles. The contaminating particles and residue may include hydrocarbons. Hydrocarbon contamination may not be completely removed during mask cleaning operations. Hydrocarbon contamination may cause proximity and critical dimension uniformity drift and white spot defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B, 4C, 4D, 4E, 4F, 4G, and 4H schematically illustrate a method of fabricating and cleaning a photomask according to an embodiment of the disclosure.

FIGS. 6A, 6B, 6C, 6D, 6E, 6F, 6G, 6H, and 6I schematically illustrate a method of fabricating and cleaning a photomask according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography masks and methods. In an EUVL tool, a laser-produced plasma (LPP) generates extreme ultraviolet radiation which is used to image a photoresist-coated substrate. In an EUV tool, an excitation laser heats metal (e.g., tin, lithium, etc.) target droplets in the LPP chamber to ionize the droplets to plasma, which emits the EUV radiation. For reproducible generation of EUV radiation, the target droplets arriving at the focal point (also referred to herein as the "zone of excitation") have to be substantially the same size and arrive at the zone of excitation at the same time as an excitation pulse from the excitation laser arrives. Thus, stable generation of target droplets that travel from the target droplet generator to the zone of excitation at a uniform (or predictable) speed contributes to efficiency and stability of the LPP EUV radiation source.

Figure 1:
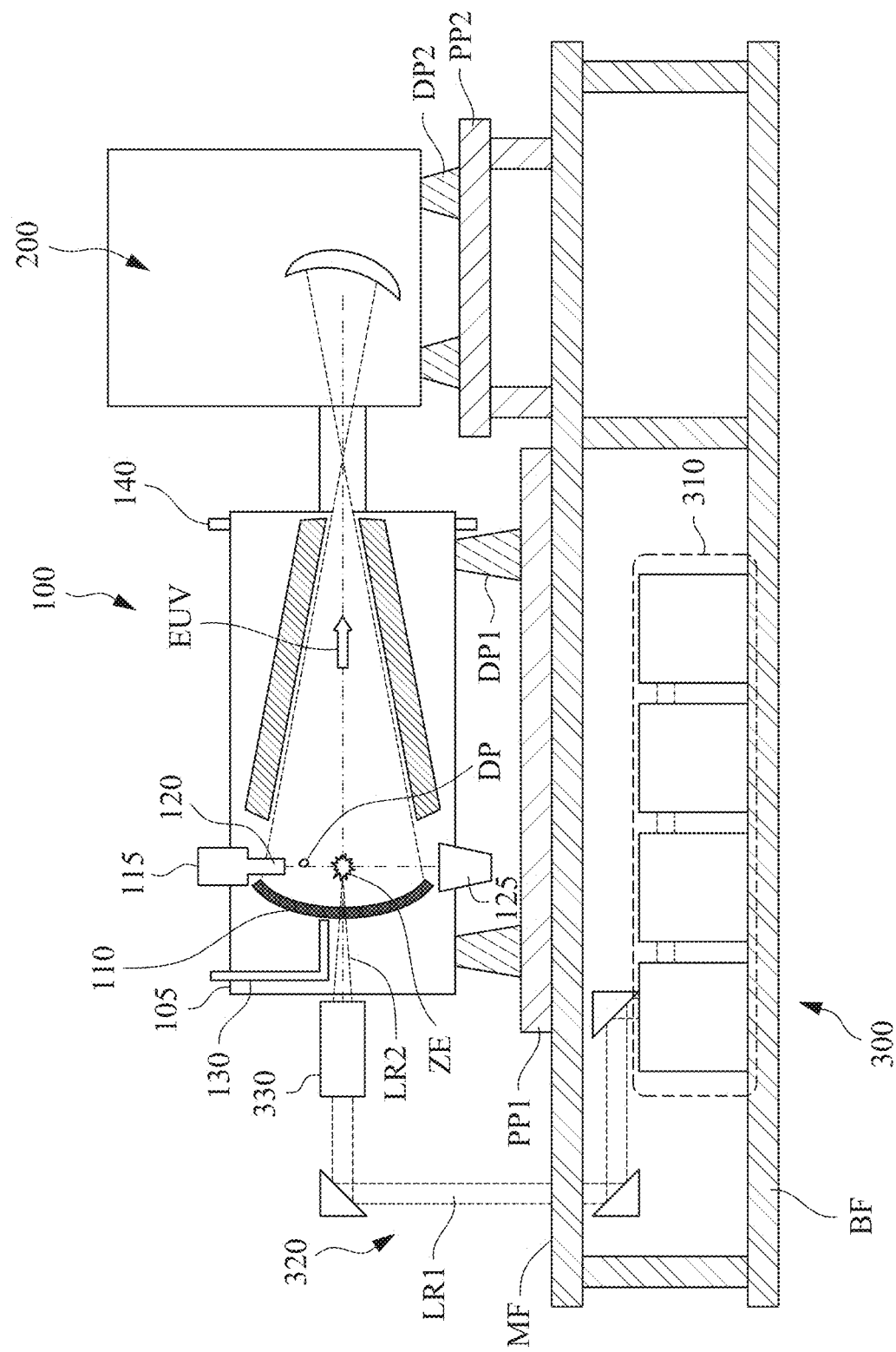
FIG. 1 shows an extreme ultraviolet lithography tool according to an embodiment of the disclosure.

FIG. 1 is a schematic view of an EUV lithography tool with a laser production plasma (LPP) based EUV radiation source, constructed in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a photomask secured on the mask stage. In some embodiments, the mask stage includes an electrostatic chuck (e-chuck) to secure the photomask.

Figure 2:
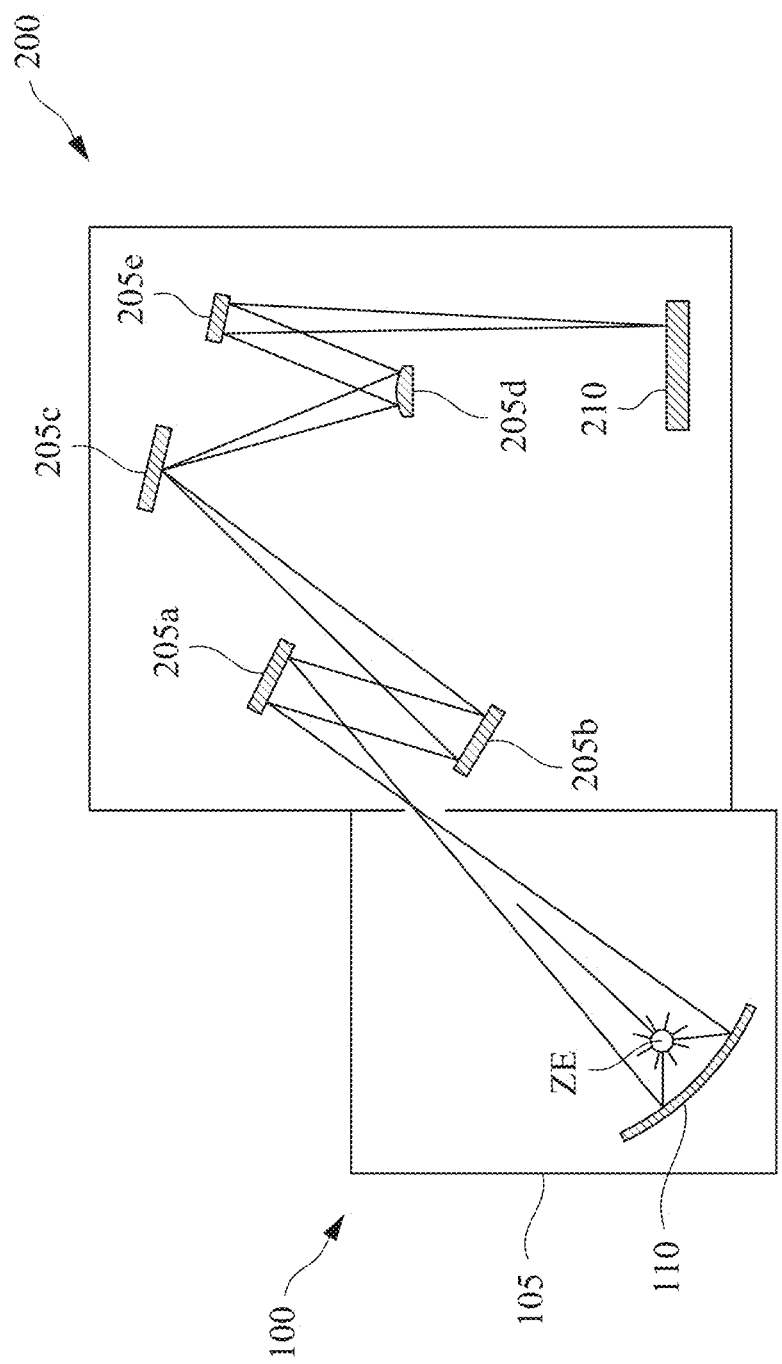
FIG. 2 shows a schematic diagram of a detail of an extreme ultraviolet lithography tool according to an embodiment of the disclosure.

FIG. 2 is a simplified schematic diagram of a detail of an extreme ultraviolet lithography tool according to an embodiment of the disclosure showing the exposure of a photoresist-coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a photomask, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a-low pressure environment to avoid EUV intensity loss.

Figure 3:
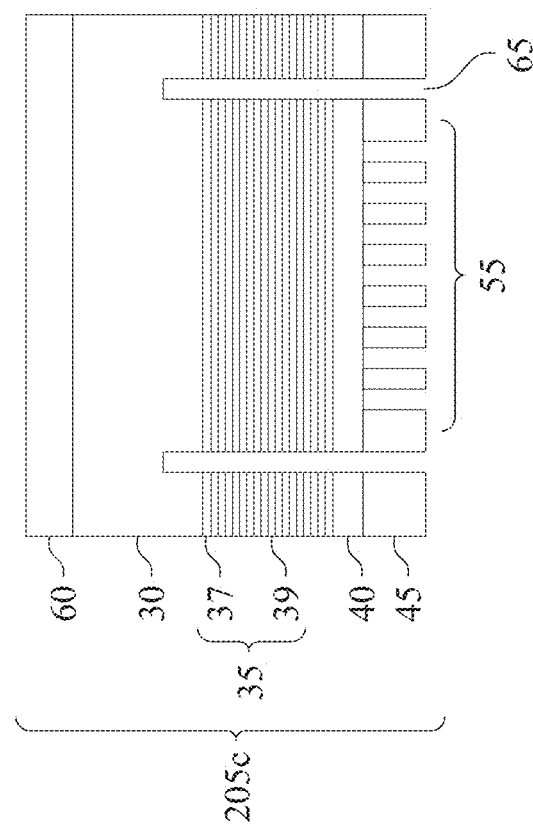
FIG. 3 is a cross-sectional view of a reflective mask according to embodiments of the disclosure.

In the present disclosure, the terms mask, photomask, and reticle are used interchangeably. In the present embodiment, the patterning optic 205c shown in FIG. 3 is a reflective photomask. In an embodiment, the reflective reticle 205c includes a substrate 30 with a suitable material, such as a low thermal expansion material or fused quartz, as shown in FIG. 3. In various examples, the material includes $TiO_2$ doped $SiO_2$, or other suitable materials with low thermal expansion. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet.

The reflective reticle 205c includes multiple reflective layers 35 deposited on the substrate. The multiple reflective layers 35 includes a plurality of film pairs, such as molybdenum-silicon (Mo/Si) film pairs (e.g., a layer of molybdenum 39 above or below a layer of silicon 37 in each film pair). Alternatively, the multiple reflective layers 35 may include molybdenum-beryllium (Mo/Be) film pairs, or other suitable materials that are configured to highly reflect the EUV light. In some embodiments, the Mo/Si multilayer stack 35 includes from about 30 alternating layers each of silicon and molybdenum to about 60 alternating layers each of silicon and molybdenum. In some embodiments, from about 35 to about 50 alternating layers each of silicon and molybdenum are formed. In certain embodiments, there are about 40 alternating layers each of silicon and molybdenum. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each layer of silicon and molybdenum is about 3 nm to about 4 nm.

The mask 205c may further include a capping layer 40, such as a layer made of ruthenium (Ru) for protection of the multilayer 35. The capping layer 40 is disposed over the Mo/Si multilayer 35. In some embodiments, the capping layer 40 is made of ruthenium having a thickness of from about 2 nm to about 10 nm. In certain embodiments, the thickness of the capping layer 40 is from about 2 nm to about 4 nm. In some embodiments, the capping layer 40 is formed by chemical vapor deposition, plasma-enhanced chemical vapor deposition, atomic layer deposition, physical vapor deposition, or any other suitable film forming method.

The mask further includes an absorption (or absorber) layer 45. The absorber layer 45 is disposed over the capping layer 40 in some embodiments. The absorption layer 45 is patterned to define a layer of an integrated circuit (IC). In some embodiments, the absorber layer 45 is Ta-based material. In some embodiments, the absorber layer is made of TaN, TaO, TaBN, or TaBO having a thickness from about 25 nm to about 100 nm. In certain embodiments, the absorber layer 25 thickness ranges from about 50 nm to about 75 nm. In some embodiments, the absorber layer 25 is formed by chemical vapor deposition, plasma-enhanced chemical vapor deposition, atomic layer deposition, physical vapor deposition, or any other suitable film forming method.

In some embodiments, an antireflective layer (not shown) is optionally formed over the absorber layer 45. The anti-reflective layer is made of a silicon oxide in some embodiments, and has a thickness of from about 2 nm to about 10 nm. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method.

EUV masks require very low surface roughness and must have no resolvable defects.

The reflective mask 205c includes a backside conductive layer 60 in some embodiments. In some embodiments, the conductive layer 60 is formed on a second main surface of the substrate 30 opposing the first main surface of the substrate 30 on which the Mo/Si multilayer 35 is formed. In some embodiments, the conductive layer 60 is made of chromium, chromium nitride, or TaB having a thickness of about 25 nm to about 150 nm. In some embodiments, the conductive layer 60 has a thickness of about 70 nm to about 100 nm. In some embodiments, the conductive layer 60 is formed by chemical vapor deposition, plasma-enhanced chemical vapor deposition, atomic layer deposition, physical vapor deposition, or any other suitable film forming method.

In some embodiments, the reflective mask 205c includes a border 65 etched down to the substrate 30 surrounding the pattern 55, also known as a black border 65, to define a circuit area to be imaged and a peripheral area not to be imaged. The black border reduces light leakage in some embodiments.

In various embodiments of the present disclosure, the photoresist-coated substrate 210 is a semiconductor wafer, such as a silicon wafer or other type of wafer to be patterned.

The EUVL tool further include other modules or is integrated with (or coupled with) other modules in some embodiments.

As shown in FIG. 1, the EUV radiation source 100 includes a target droplet generator 115 and a LPP collector 110, enclosed by a chamber 105. In some embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz). In some embodiments, the target droplets DP are supplied at an ejection-frequency of about 100 Hz to a about 25 kHz. In other embodiments, the target droplets DP are supplied at an ejection frequency of about 500 Hz to about 10 kHz. The target droplets DP are ejected through the nozzle 127 and into a zone of excitation ZE at a speed in a range of about 10 meters per second (m/s) to about 100 m/s in some embodiments. In some embodiments, the target droplets DP have a speed of about 10 m/s to about 75 m/s. In other embodiments, the target droplets have a speed of about 25 m/s to about 50 m/s.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. The droplet catcher is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes an alternating stack of first and second reflective layers (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases, and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

FIGS. 4A-4H schematically illustrate a method of fabricating and cleaning an EUV photomask 205*c* for use in extreme ultraviolet lithography (EUVL). EUVL employs scanners using light in the extreme ultraviolet (EUV) region, having a wavelength of about 1 nm to about 100 nm. The mask is a critical component of an EUVL system. EUV masks are usually reflective masks.

Figure 4A:
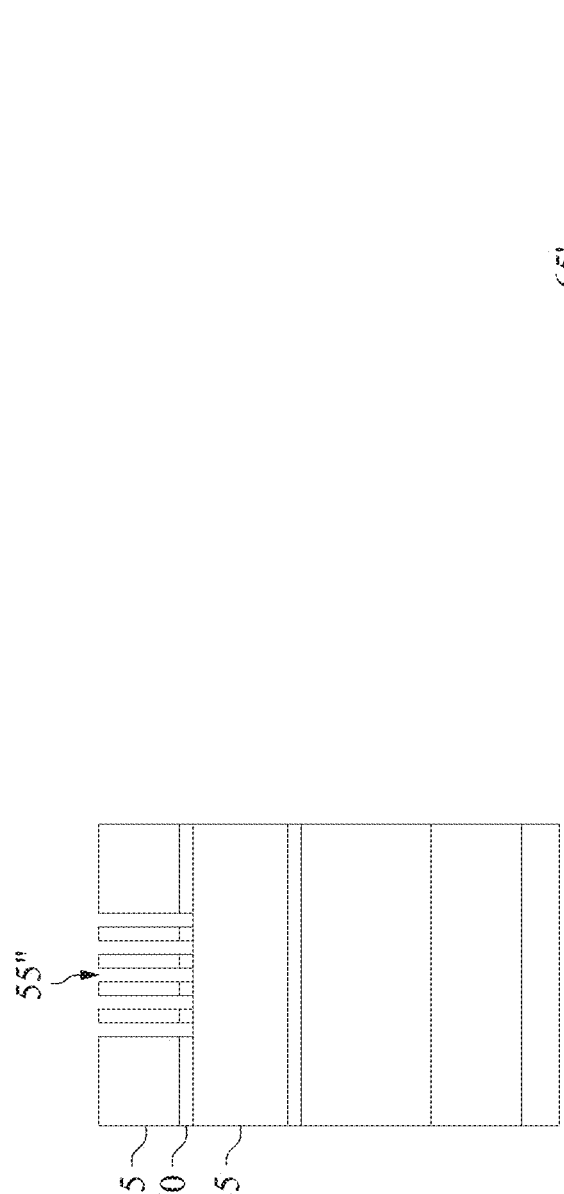

The photomask 205*c* is formed from a photomask blank 20 including: the substrate 30, multilayer 35, capping layer 40, absorber layer 45, and conductive layer 60. As shown in FIG. 4A, a hard mask layer 50 is formed over the absorber layer 45 in some embodiments. The hard mask layer 50 is formed over the antireflective layer in some embodiments. In some embodiments, the hard mask layer 50 is made of silicon, a silicon-based compound, chromium, or a chromium-based compound having a thickness of about 4 nm to about 20 nm. In some embodiments, the chromium-based compound includes CrON. In some embodiments, the hard mask layer 50 is formed by chemical vapor deposition, plasma-enhanced chemical vapor deposition, atomic layer deposition, physical vapor deposition, or any other suitable film forming method.

A photoresist layer 75 is subsequently formed over the hard mask layer 50, and the photoresist layer 75 is selectively exposed to actinic radiation. The photoresist layer 75 is a photosensitive layer that is patterned by exposure to actinic radiation. Typically, the chemical properties of the photoresist regions struck by incident radiation change in a manner that depends on the type of photoresist used. The photoresist layers 75 are either positive tone resists or negative tone resists. A positive tone resist refers to a photoresist material that when exposed to radiation (typically UV light) becomes soluble in a developer, while the region of the photoresist that is non-exposed (or exposed less) is insoluble in the developer. A negative tone resist, on the other hand, conventionally refers to a photoresist material that when exposed to radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation.

The selectively exposed photoresist layer 75 is developed to form a pattern 55' in the photoresist layer 75. In some embodiments, the actinic radiation is an electron beam or an ion beam. In some embodiments, the pattern 55 corresponds to a pattern of semiconductor device features for which the photomask 205*c* will be used to form in subsequent operations. Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Figure 4B:
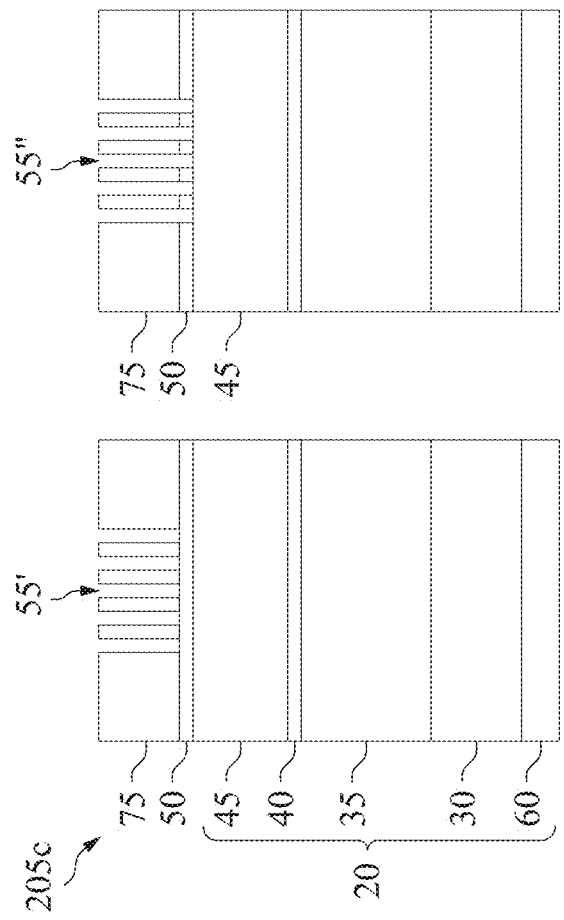

Next, the pattern 55' in the photoresist layer 75 is extended into the hard mask layer 50 forming a pattern 55" in the hard mask layer 50 exposing portions of the absorber layer 45, as shown in FIG. 4B. The pattern 55" extended into the hard mask layer 50 is formed by etching, in some embodiments, using a suitable wet or dry etchant that is selective to the hard mask layer 50.

Figure 4C:
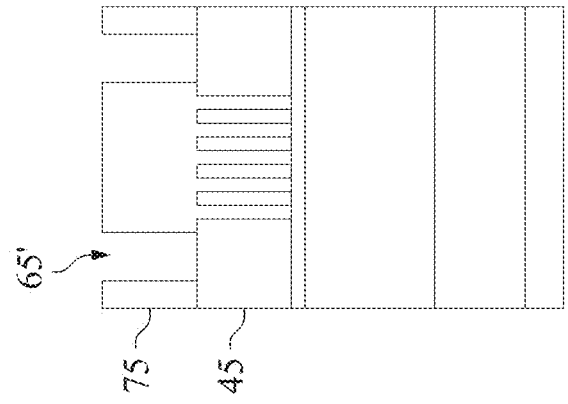

Then, the pattern 55" in the hard mask layer 50 is extended into the absorber layer 45 forming a pattern 55' in the absorber layer 45 exposing portions of the capping layer 40, as shown in FIG. 4C. The pattern 55''' extended into the absorber layer 45 is formed by etching, in some embodiments, using a suitable wet or dry etchant that is selective to the absorber layer 45. In some embodiments, the capping layer 40 functions as an etch-stop layer. The photoresist layer 75 is removed by a suitable photoresist stripper or oxygen plasma ashing operation to expose the upper surface of the hard mask layer 50.

Figure 4D:
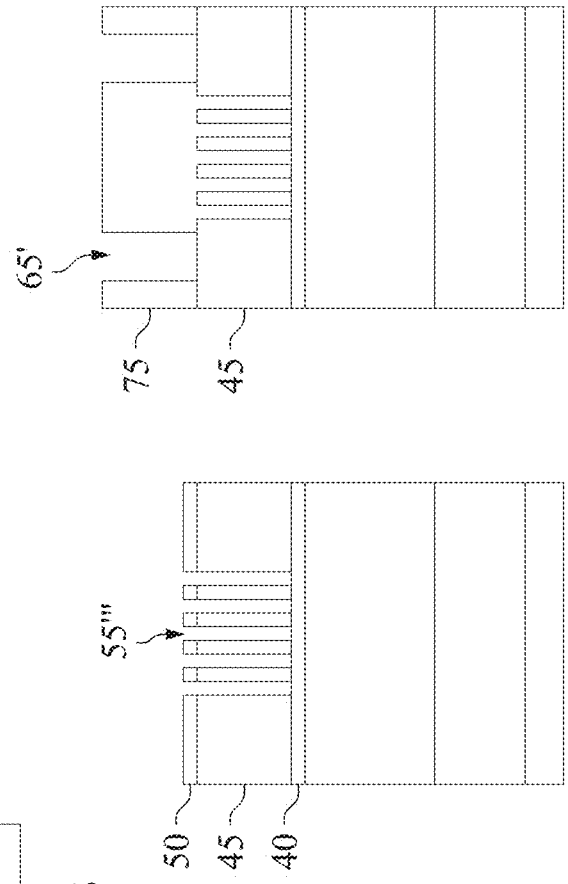

As shown in FIG. 4D, a second photoresist layer 85 is formed over the absorber layer 45 filling the pattern 55 in the absorber layer after removing the hard mask layer 50. The hard mask layer is removed by etching using an etchant selective to the hard mask layer. The second photoresist layer 85 is selectively exposed to actinic radiation. The selectively exposed second photoresist layer 85 is developed to form a pattern 65' in the second photoresist layer 85, as shown in FIG. 4D.

Next, the pattern 65' in the second photoresist layer 85 is extended into the absorber layer 55, capping layer 40, and Mo/Si multilayer 35 forming a pattern 65" in the absorber layer 45, capping layer 40, and Mo/Si multilayer 35 exposing portions of the substrate 30, as shown in FIG. 4E. The pattern 65" is formed by etching, in some embodiments, using one or more suitable wet or dry etchants that are selective to each of the layers that are etched.

In some embodiments, the second photoresist layer 85 is removed by a suitable photoresist stripper or an oxygen plasma ashing operation to expose the upper surface of the absorber layer 45. The pattern 65 in the absorber layer 45, capping layer 40, and the Mo/Si multilayer 35 defines a black border of the photomask 205c in some embodiments of the disclosure, as shown in FIG. 4F. After removal of the second photoresist layer, the photomask 205c undergoes a cleaning operation, inspection, and the photomask 205c is repaired as necessary, to provide a finished photomask 205c. In some embodiments, the black border 65 is formed first and then the semiconductor device pattern 55 is formed.

During the photomask manufacture or subsequent processing using the finished photomask 205c, including EUV exposures of photoresist-coated substrates using the photomask, carbon-based residue, including hydrocarbon contamination 95 is formed on pattern 55 in the absorber layer. The contamination can be created by heat generated during EUV exposure that causes partial decomposition and volatilization of the photoresist. The decomposed and volatilized residues can contaminate the photomask. In addition, during long term mask storage the mask can be contaminated by particles and residue that become attached to the mask by Van der Waals forces. Hydrocarbon contamination 95 may adversely affect the performance of the photomask 205c, including causing proximity and critical dimension uniformity drift, and white spot defects. The thickness of the carbon residue over the mask pattern 55, increases the mask pattern dimensions to change and thereby causing a change in the critical dimension of patterns subsequently formed in a photoresist layer. Therefore, after prolonged use or storage, the performance of the photomask 205c declines.

To restore the performance of the photomask 205c and maintain the proximity and critical dimension of patterns formed by the photomask 205c, periodic maintenance of the photomask 205c is performed in some embodiments of the disclosure. For example, as shown in FIG. 4H, a carbon-based residue (i.e.—hydrocarbon) removal operation is performed. In some embodiments, dry etching, including plasma etching, (a clean-flash or "c-flash" operation) is performed on the photomask. In some embodiments, the oxygen or hydrogen plasma is applied to the carbon-residue contaminated photomask to remove the carbon-residue contamination. In some embodiments, oxygen plasma is applied to the contaminated photomask and the hydrocarbon is removed according to the following reaction: $C_mH_n + O \rightarrow H_2O + CO_2$ (or CO if incomplete oxidation). In other embodiments, hydrogen plasma is applied to the contaminated photomask and the hydrocarbon is removed according to the following reaction: $C_mH_n + H \rightarrow CH_4 + H_2$. In both the oxygen plasma and hydrogen plasma embodiments, the reaction products are gases that are evacuated from the plasma reaction chamber.

Figure 5:
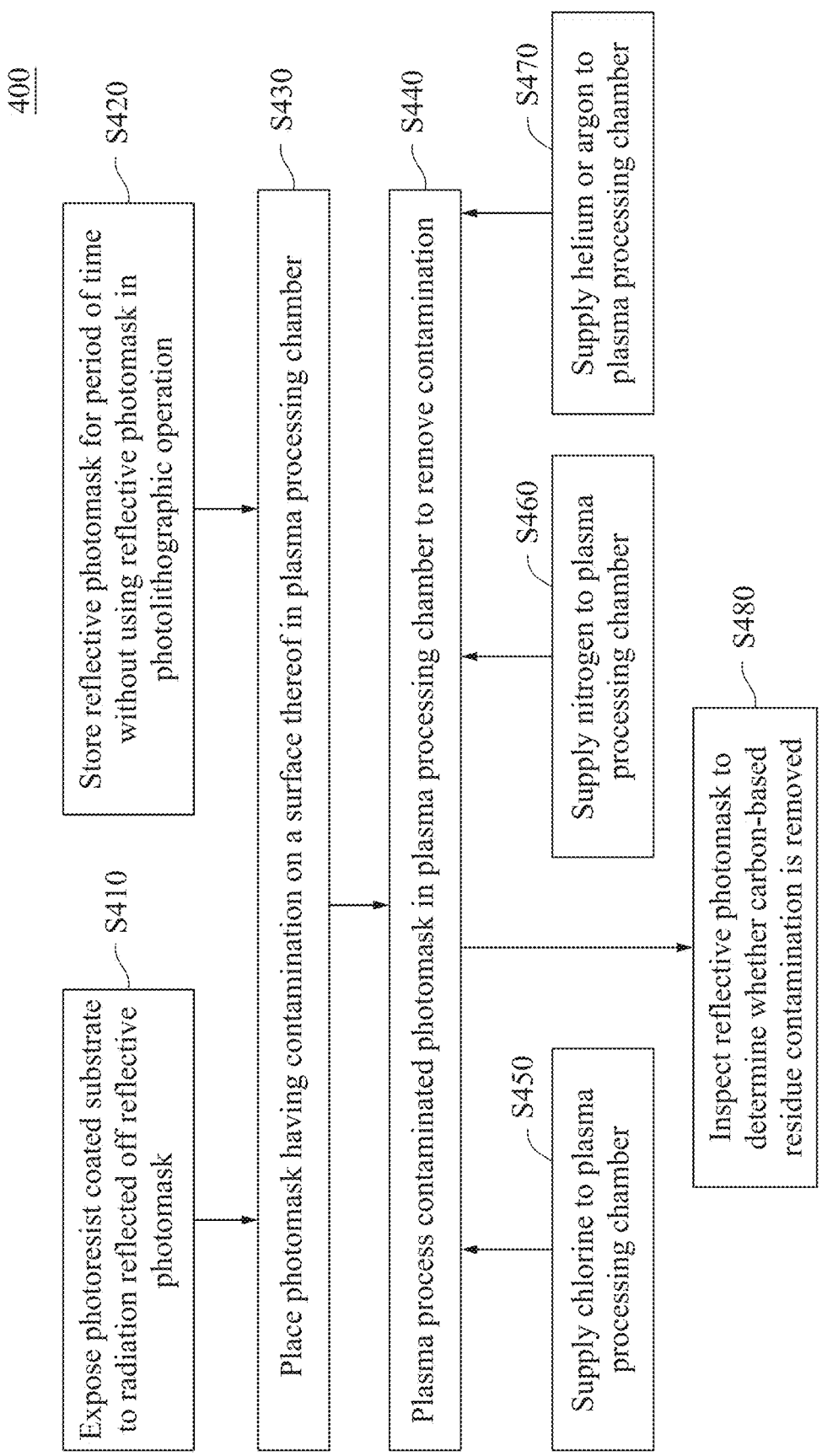
FIG. 5 is a flowchart illustrating a method of removing contamination from a photomask according to an embodiment of the disclosure.

FIG. 5 is a flowchart illustrating a method 400 of removing contamination from a photomask according to an embodiment of the disclosure. In operation S410, a photoresist-coated substrate is exposed to actinic radiation reflected off of a reflective photomask 205c. In operation S420, a reflective photomask 205c is stored for a period of time without using the reflective photomask in a photolithographic operation. Contamination forms on a surface of the reflective photomask during the exposing or storing. After either operation S410 or operation S420, the reflective photomask having contamination on a surface thereof is placed in a plasma processing chamber in operation S430. The contaminated reflective photomask is plasma processed (c-flash) in the plasma processing chamber to remove the contamination from the surface in operation S440. The plasma includes oxygen plasma or hydrogen plasma. In some embodiments, chlorine is supplied to the plasma processing chamber during the plasma process in operation S450. In some embodiments, nitrogen is supplied to the plasma processing chamber during the plasma process in operation S470. In some embodiments, helium or argon are supplied to the plasma processing chamber during the plasma process in operation S470. In some embodiments, the reflective photomask 205c is inspected in operation S480 to determine whether the contamination is removed.

In some embodiments, the photomask 205c is inspected using visual techniques. The visual techniques may include using transmission electron microscopy (TEM) to image the surface of the mask. In some embodiments, energy-dispersive X-ray spectroscopy (EDS) is used along with TEM to map the distribution of carbon-residue contaminants on the photomask. Because hydrocarbons absorb infrared radiation, infrared analysis techniques are used to inspect the surface of the mask in some embodiments. In some embodiments, critical dimension uniformity drift, proximity drift, or white spot defects are monitored in the patterns formed on the photoresist-coated substrates, and when the critical dimension uniformity drift, proximity drift, or the number of white spot defects exceed a threshold value, the photomask is subjected to the plasma contamination removal processes (c-flash) described herein.

In some embodiments, contaminant removal from the surface of the photomask using the plasma process (c-flash) according to the disclosure is performed after about 100 to about 2500 or more exposures (or shots) of photoresist-coated substrates to actinic radiation using the photomask. In some embodiments, the contaminant removal using the plasma process according to the disclosure is performed after about 2000 or more exposures (shots) of photoresist-coated substrates using the photomask. In some embodiments, the contaminant removal is performed after about 1000 or more exposures (shots) of photoresist-coated substrates using the photomask.

In some embodiments, proximity bias drift or critical dimension uniformity drift, or white spot defects are monitored, and the contaminant removal using plasma process according to the disclosure is performed when the proximity bias drift, critical dimension uniformity drift, or white spot defects exceed a certain threshold value.

FIGS. 6A-6I schematically illustrate a method of fabricating and cleaning a photomask 205c. The operations in FIGS. 6A-6F of fabricating the photomask are the same as the operations in FIGS. 4A-4F. The contamination of the pattern layer 55 in the absorber layer occurs during storage of the photomask in a photomask pod 90. During long term mask storage, the mask can be contaminated by particles and residue that become attached to the mask by Van der Waals forces. In this embodiment, the contaminants 95, shown in FIG. 6H, that attach to the surface of the mask during storage (FIG. 6G) are also carbon-based residue (i.e.—hydrocarbon), as explained in reference to FIG. 4G. Thus, the contamination is removed in FIG. 6I in the same manner as discussed with reference to FIG. 4H. In some embodiments, the photomask 205c is stored in the photomask pod 90 for more than 30 days prior to the plasma contaminant removal operations of the disclosure. In some embodiments, the photomask 205c is stored for about 30 days to about 180 days in the photomask pod 90 prior to the plasma contaminant operation of the disclosure.

Figure 7:
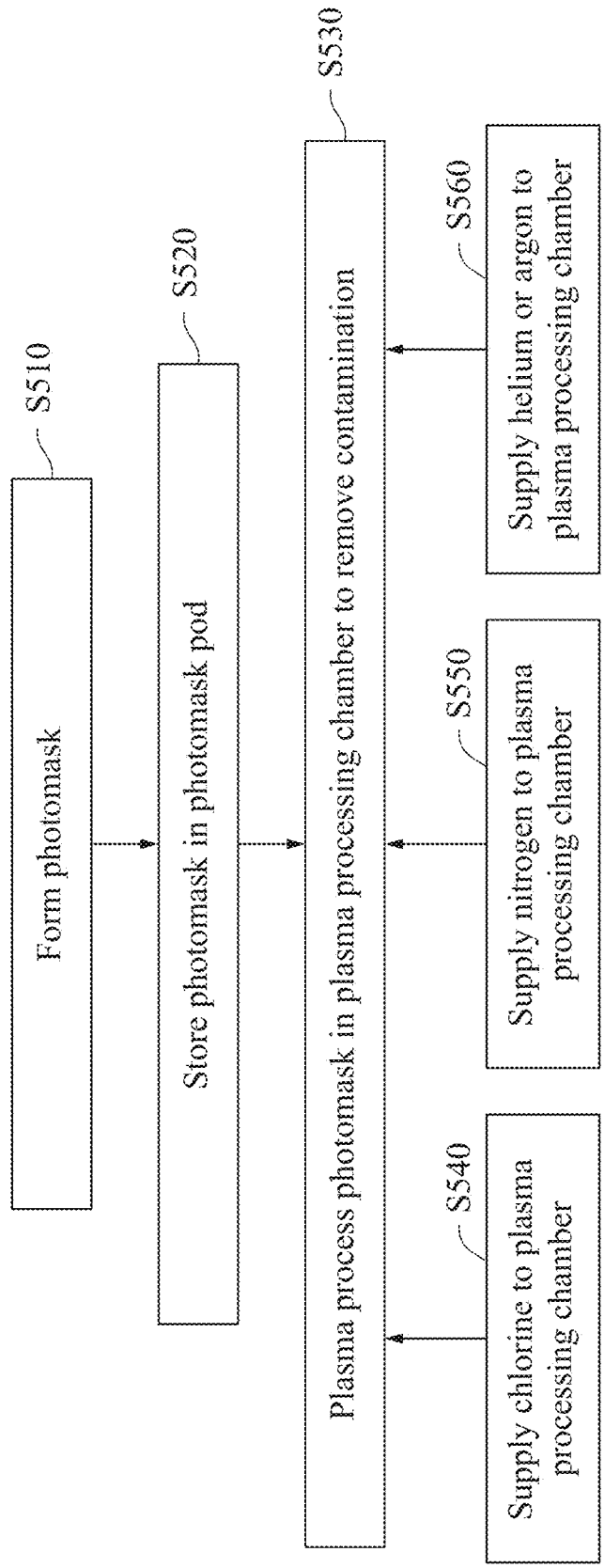
FIG. 7 is a flowchart illustrating a method of manufacturing a photomask and removing contamination from the photomask according to an embodiment of the disclosure.

FIG. 7 is a flowchart illustrating a method 500, including an operation S510 of forming a photomask 205c. The photomask 205c is stored in a photomask pod 90 in operation S520. In some embodiments, the photomask is stored for about 30 days or more in the photomask pod 90. After removing the photomask 205c from the photomask pod 90, the photomask 205c is plasma processed in a plasma processing chamber in operation S530 to remove contamination 95 from a surface of the photomask 205c. The plasma includes oxygen plasma or hydrogen plasma. In some embodiments, chlorine is supplied to the plasma processing chamber during the plasma process in operation S540. In some embodiments, nitrogen is supplied to the plasma processing chamber during the plasma process in operation S550. In some embodiments, helium or argon are supplied to the plasma processing chamber during the plasma process in operation S560.

In some embodiments, during the plasma removal of the carbon-based residues the source power of the plasma source ranges from about 100 W to about 1000 W for embodiments 1 to 7. The bias power is about 0 W. The pressure in the plasma processing chamber ranges from about 1 mtorr to about 5 mtorr. The flow rate of oxygen in the plasma processing chamber ranges from about 0 sccm to about 100 sccm. The flow rate of hydrogen in the plasma processing chamber ranges from about 0 sccm to about 300 sccm. A flow rate of nitrogen ranges from about 0 sccm to about 50 sccm. Chlorine is supplied to the plasma processing chamber at a flow rate of about 20 sccm to about 100 sccm. He or Ar are supplied to the plasma processing chamber at a flow rate of about 0 sccm to about 300 sccm. The plasma is applied to the contaminated photomask for a duration of about 5 s to about 100 s. In some embodiments, the power applied to the chamber is RF power, such as 13.6 KHz RF power.

In some embodiments, the source power applied to the chamber ranges from about 200 W to about 800 W. In some embodiments, the source power applied to the chamber ranges from about 400 W to about 600 W. In some embodiments, oxygen is applied to the chamber at a flowrate of about 10 sccm to about 100 sccm. In some embodiments, oxygen is applied to the chamber at a flowrate of about 20 sccm to about 80 sccm. In some embodiments, hydrogen is applied to the chamber at a flowrate of about 20 sccm to about 100 sccm. In some embodiments, hydrogen is applied to the chamber at a flowrate of about 30 sccm to about 80 sccm. In some embodiments, nitrogen is applied to the chamber at a flowrate of about 10 sccm to about 50 sccm. In some embodiments, nitrogen is applied to the chamber at a flowrate of about 20 sccm to about 40 sccm. In some embodiments, chlorine is applied to the chamber at a flowrate of about 20 sccm to about 100 sccm. In some embodiments, chlorine is applied to the chamber at a flowrate of about 40 sccm to about 80 sccm. In some embodiments, helium or argon are applied to the chamber at a flowrate of about 60 sccm to about 300 sccm. In some embodiments, helium or argon are applied to the chamber at a flowrate of about 100 sccm to about 250 sccm. In some embodiments, the plasma is applied to the photomask for about 20 s to about 80 s. In some embodiments, the plasma applied to the photomask for about 30 s to about 70 s.

In some embodiments, oxygen and chlorine are the only gases supplied to the chamber. In some embodiments, oxygen and nitrogen are the only gases supplied to the chamber. In some embodiments, oxygen and helium are the only gases supplied to the chamber. In some embodiments, oxygen and argon are the only gases supplied to the chamber. In some embodiments, hydrogen is the only gas supplied to the chamber. In some embodiments, hydrogen and helium are the only gases supplied to the chamber. In some embodiments, hydrogen and argon are the only gases supplied to the chamber.

In some embodiments, oxygen has a higher carbon residue removal rate than hydrogen, which has a higher carbon removal rate than argon and helium. However, the higher the carbon removal rate of the gas also can result in Ru capping layer damage if the c-flash cleaning treatment time is not adequately monitored. Once the carbon residue is removed, the plasma should be turned off to avoid damage to the mask.

Figure 8:
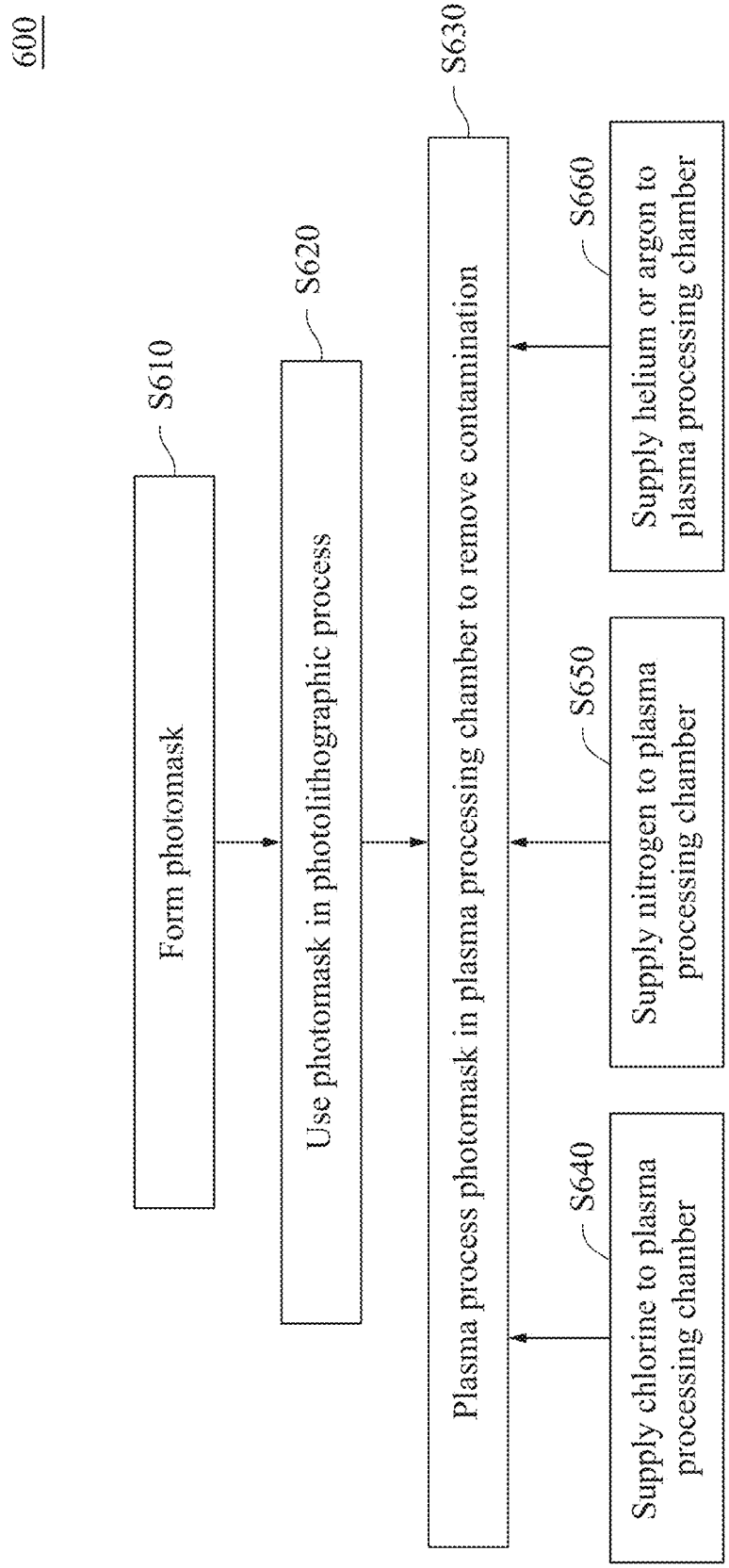
FIG. 8 is a flowchart illustrating a method of manufacturing and using a photomask and removing contamination from the photomask according to an embodiment of the disclosure.

FIG. 8 is a flowchart illustrating a method 600 according to an embodiment of the disclosure. In operation S610, a photomask 205c is formed. In some embodiments, forming the photomask includes forming the multilayer, capping layer, and absorber layer over the substrate, and then patterning the absorber layer to form the mask pattern. The photomask 205c is used in a photolithographic process in operation S620 to form a photoresist pattern on a substrate. In some embodiments, the photomask 205c is used for 1000 or more exposures (or shots). In some embodiments, the photomask 205c is used for 2000 or more exposures (shots). After a number of exposures (shots), the photomask 205c is plasma processed in a plasma processing or cleaning chamber in operation S630 to remove contamination from a surface of the photomask. The plasma includes oxygen plasma or hydrogen plasma. In some embodiments, chlorine is supplied to the plasma processing chamber during the plasma process in operation S640. In some embodiments, nitrogen is supplied to the plasma processing chamber during the plasma process in operation S650. In some embodiments, helium or argon are supplied to the plasma processing chamber during the plasma process in operation S660.

Figure 9:
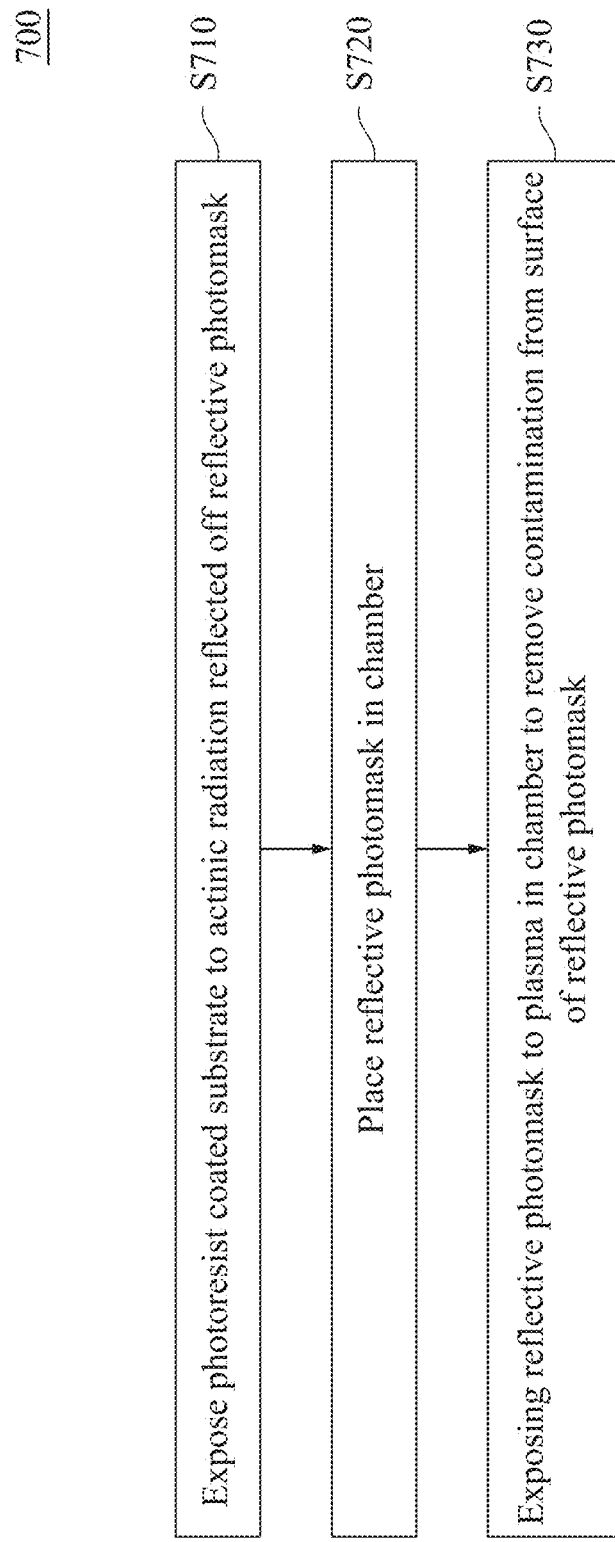
FIG. 9 is a flowchart illustrating a method of using a photomask and removing contamination from the photomask according to an embodiment of the disclosure.

FIG. 9 is a flowchart illustrating a method 700 according to an embodiment of the disclosure. In operation S710, a photoresist-coated substrate is exposed to actinic radiation reflected off of a reflective photomask 205c. After a number of exposures (shots), the reflective photomask 205c is placed in a chamber, such as a cleaning chamber, in operation S720. The reflective photomask 205c is exposed to a plasma in the chamber in operation S730 to remove contamination from a surface of the photomask. The plasma includes oxygen plasma or hydrogen plasma.

Figure 10:
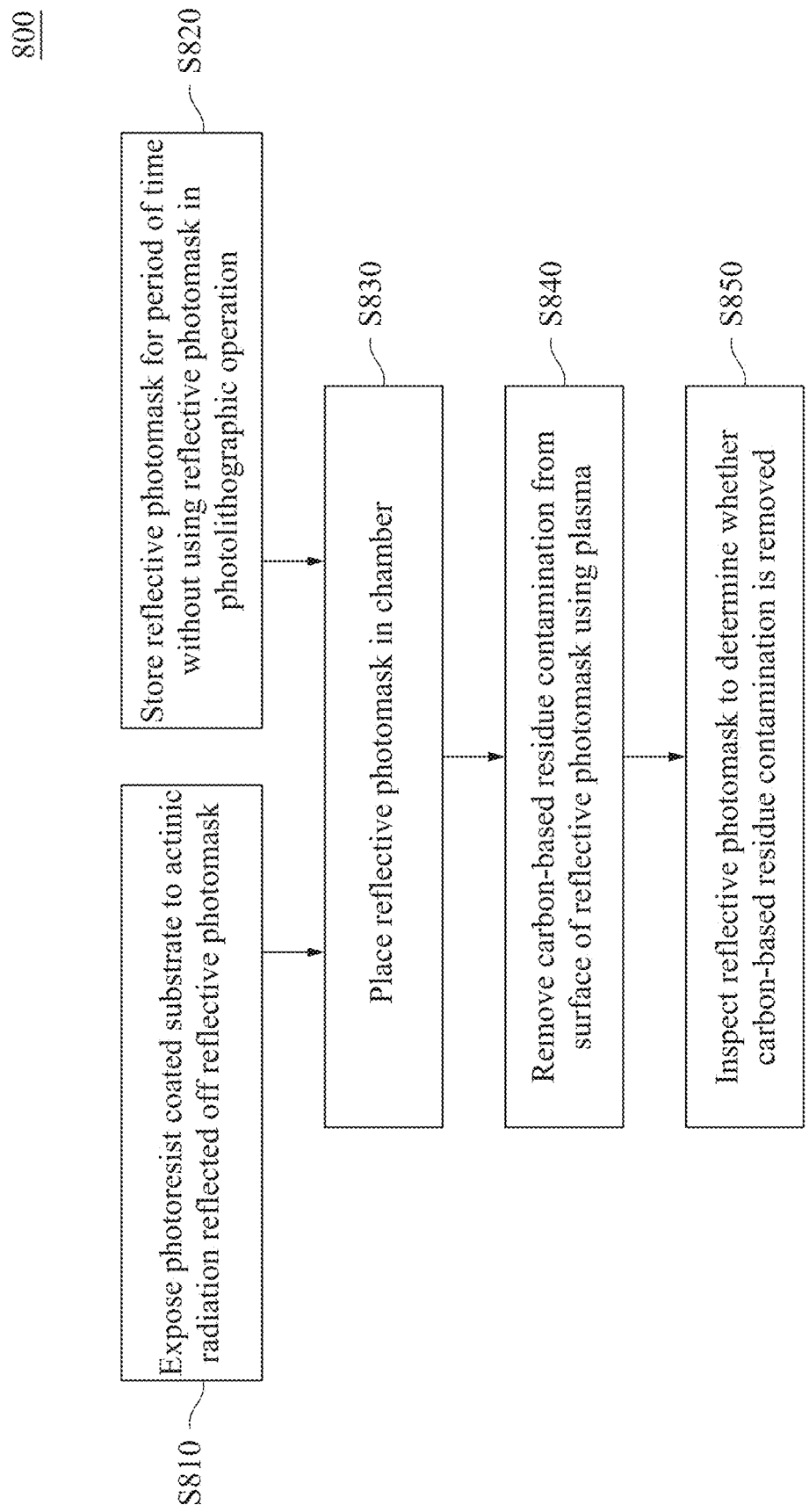
FIG. 10 is a flowchart illustrating a method of reducing white spot defects and critical dimension uniformity drift according to an embodiment of the disclosure.

FIG. 10 is a flowchart illustrating a method 800 or reducing white spot defects and critical dimension uniformity drift according to an embodiment of the disclosure. In operation S810, a photoresist-coated substrate is exposed to actinic radiation reflected off of a reflective photomask 205c. In operation S820, a reflective photomask 205c is stored for a period of time without using the reflective photomask in a photolithographic operation. After either operation S810 or operation S820, the reflective photomask 205c is placed in a chamber in operation S830. Carbon-based residue contamination is removed from the surface of the reflective photomask 205c using a plasma in operation S840. In some embodiments, the reflective photomask 205c is inspected in operation S850 to determine whether the carbon-based residue contamination is removed.

Figure 11:
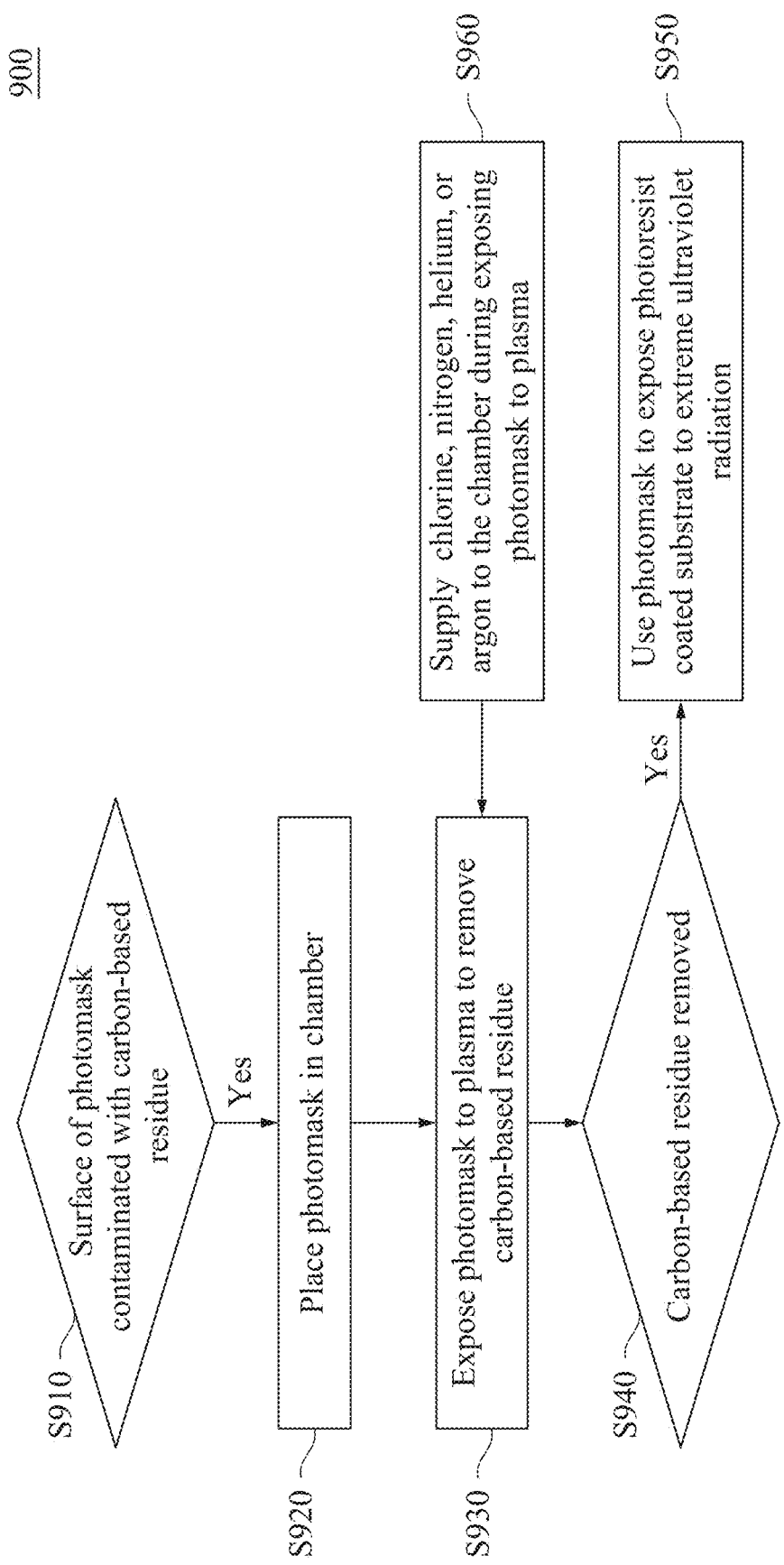
FIG. 11 is a flowchart illustrating a method of removing contamination from a photomask according to an embodiment of the disclosure.

FIG. 11 is a flowchart illustrating a method 900 according to an embodiment of the disclosure. In operation S910, it is determined whether a surface of a photomask 205c is contaminated with a carbon-based residue. The photomask 205c is placed in a chamber in operation S920 when it is determined the photomask 205c is contaminated with the carbon-based residue. In some embodiments, the photomask 205c is placed in the chamber when the amount of carbon-residue contamination reaches a threshold amount. In operation S930, the photomask is exposed to a plasma to remove the carbon-based residue. After the exposure to plasma, it is determined in operation S940 whether the carbon residue contamination is removed. When the carbon residue contamination is removed in operation S940, the photomask 205c is used in some embodiments to expose a photoresist-coated substrate to extreme ultraviolet radiation in operation S950. In some embodiments, chlorine, nitrogen, helium, or argon are supplied to the chamber during the exposing the photomask to plasma in operation S960.

In some embodiments, the determination of whether the surface of the photomask is contaminated with carbon-based residue and the determination of whether the carbon-based residue is removed is achieved by inspecting the surface of the photomask. In some embodiments, the inspection is performed using visual techniques. The visual techniques may include using transmission electron microscopy (TEM) to image the surface of the mask. In some embodiments, energy-dispersive X-ray spectroscopy (EDS) is used along with TEM to map the distribution of carbon-residue contaminants on the photomask. In some embodiments, infrared analysis techniques are used. In other embodiments, critical dimension uniformity drift, proximity drift, or white spot defects are monitored in the patterns formed on the photoresist-coated substrates, and when the critical dimension uniformity drift, proximity drift, or the number of white spot defects exceed a threshold value, the photomask is subjected to the plasma contamination removal processes described herein.

Photomasks subjected to the plasma removal (c-flash) of carbon-based residue according to embodiments of the disclosure have improved proximity and critical dimension uniformity. In addition, methods according to the present disclosure reduces white spot defects on EUV photomasks. The methods of the present disclosure, therefore, provide sharper, higher contrast patterned features than patterned features formed using photomasks that are not subjected to the plasma removal operations of the present disclosure.

In some embodiments, performing hydrocarbon contamination removal according to the present disclosure improves the critical dimension uniformity. In some embodiments, an improvement of about 50% or more of the standard deviation of the critical dimension uniformity is achieved over the use of photomasks that do not undergo the hydrocarbon contamination removal according to embodiments of the disclosure. In some embodiments, the standard deviation of the critical dimension uniformity of patterns formed by photomasks after about 2000 exposures without performing the hydrocarbon removal operation (c-flash) of the present disclosure is about 0.63, and the standard deviation of the critical dimension uniformity of patterns formed by photomasks after about 2000 exposures and the hydrocarbon removal operation of the present disclosure is about 0.34.

In some embodiments, after the plasma processing, the center to edge difference of the proximity drift across the photomask is reduced to about 0.1 nm or less. In some embodiments, after the plasma processing, the proximity drift is restored to about 0.1 nm of the initial value of the photomask prior to using the photomask to expose photoresist layers.

In some embodiments, photomasks that undergo periodic hydrocarbon contaminant removal operations according to the present disclosure have a service life of over 100× greater than photomasks that do not undergo hydrocarbon contaminant removal according to the present disclosure. Proximity and critical dimension uniformity drift becomes unacceptable in some embodiments after about 800 exposures without performing the hydrocarbon removal operation (c-flash) of the present disclosure. Use of the hydrocarbon removal operation of the present disclosure increases the number exposures to about 17,000 between c-flash operations until the proximity and critical dimension uniformity drift becomes unacceptable in some embodiments, an increase in the number of exposures of more than 20×. Because the c-flash operation may be performed up to five times, the total lifetime of the photomask according to the methods of the present disclosure is increased over 100× the lifetime of photomasks not undergoing the hydrocarbon removal operations of the present disclosure. Thus, the methods of the present disclosure improve semiconductor device yield, and provide a more efficient semiconductor device manufacturing process.

In some embodiments, the hydrocarbon contaminant removal operation according to the present disclosure substantially reduces or eliminates critical dimension uniformity drift; substantially reduces or eliminates proximity bias drift, and substantially reduces or eliminates white spots on the photomask.

An embodiment of the disclosure is a method, including exposing a photoresist coated substrate to radiation reflected off of a reflective photomask, or storing the reflective photomask for a period of time without using the reflective photomask in a photolithographic operation. Contamination forms on a surface of the reflective photomask during the exposing or storing. The reflective photomask having contamination on a surface thereof is placed in a plasma processing chamber after using the reflective photomask to expose the photoresist coated substrate or after the period of time. The reflective photomask having the contamination is plasma processed in the plasma processing chamber to remove the contamination from the surface. The plasma includes oxygen plasma or hydrogen plasma. In an embodiment, the plasma processing chamber is maintained at a pressure of 1 mtorr to 5 mtorr during the plasma processing. In an embodiment, the contamination is a carbon-based residue. In an embodiment, the carbon-based residue includes a hydrocarbon. In an embodiment, the contamination is disposed on a pattern in an absorber layer of the photomask. In an embodiment, oxygen is supplied to the plasma processing chamber at a flow rate of 10 sccm to 100 sccm. In an embodiment, oxygen is supplied to the plasma processing chamber at a flow rate of 20 sccm to 50 sccm. In an embodiment, the method includes supplying chlorine to the plasma processing chamber at a flow rate of 20 sccm to 100 sccm. In an embodiment, the method includes supplying nitrogen to the plasma processing chamber at a flow rate of 10 sccm to 50 sccm. In an embodiment, hydrogen is supplied to the plasma processing chamber at a flow rate of 20 sccm to 100 sccm. In an embodiment, the method includes supplying helium or argon to the plasma processing chamber at flow rate of 60 sccm to 300 sccm. In an embodiment, a source power of the plasma processing chamber during the plasma processing ranges from 100 W to 1000 W. In an embodiment, a duration of the plasma processing ranges from 5 s to 100 s. In an embodiment, the method includes inspecting the reflective photomask to determine if the contamination is removed after exposing the reflective photomask to the plasma.

Another embodiment of the disclosure is a method, including forming a photomask, and using the photomask in a photolithographic process to form a photoresist pattern on a substrate. The photomask plasma processed in a plasma processing chamber after using the photomask in a photolithographic process to remove contamination from a surface of the photomask. The plasma includes oxygen plasma or hydrogen plasma. In an embodiment, the forming a photomask includes operations of forming a Mo/Si multilayer over a substrate, forming a capping layer over the Mo/Si multilayer, forming an absorber layer over the capping layer, forming a hard mask layer over the absorber layer, and forming a first photoresist layer over the hard mask layer. In an embodiment, the method includes patterning the first photoresist layer to expose a portion of the hard mask layer, etching the exposed portion of the hard mask layer to expose a portion of the absorber layer, etching the exposed portion of the absorber layer to expose a portion of the capping layer, and removing the hard mask layer to expose an upper surface of the absorber layer. In an embodiment, the plasma processing chamber is maintained at a pressure of 1 mtorr to 5 mtorr during the plasma processing. In an embodiment, the contamination is a carbon-based residue. In an embodiment, the carbon-based residue includes a hydrocarbon. In an embodiment, the contamination is disposed on a pattern in an absorber layer of the photomask. In an embodiment, oxygen is supplied to the plasma processing chamber at a flow rate of 10 sccm to 100 sccm. In an embodiment, oxygen is supplied to the plasma processing chamber at a flow rate of 20 sccm to 50 sccm. In an embodiment, the method includes supplying chlorine to the plasma processing chamber at a flow rate of 20 sccm to 100 sccm. In an embodiment, the method includes supplying nitrogen to the plasma processing chamber at a flow rate of 10 sccm to 50 sccm. In an embodiment, hydrogen is supplied to the plasma processing chamber at a flow rate of 20 sccm to 100 sccm. In an embodiment, the method includes supplying helium or argon to the plasma processing chamber at flow rate of 60 sccm to 300 sccm. In an embodiment, a source power of the plasma processing chamber during the plasma processing ranges from 100 W to 1000 W. In an embodiment, the duration of the plasma processing ranges from 5 s to 100 s.

Another embodiment of the disclosure is a method, including forming a photomask, and storing the photomask in a photomask pod. The photomask is plasma processed in a plasma processing chamber after storing the photomask in the photomask pod to remove contamination from a surface of the photomask. The plasma includes oxygen plasma or hydrogen plasma. In an embodiment, the forming a photomask includes operations of forming a Mo/Si multilayer over a substrate, forming a capping layer over the Mo/Si multilayer, forming an absorber layer over the capping layer, forming a hard mask layer over the absorber layer, and forming a first photoresist layer over the hard mask layer. In an embodiment, the method includes patterning the first photoresist layer to expose a portion of the hard mask layer, etching the exposed portion of the hard mask layer to expose a portion of the absorber layer, etching the exposed portion of the absorber layer to expose a portion of the capping layer, and removing the hard mask layer to expose an upper surface of the absorber layer. In an embodiment, the plasma processing chamber is maintained at a pressure of 1 mtorr to 5 mtorr during the plasma processing. In an embodiment, the contamination is a carbon-based residue. In an embodiment, the carbon-based residue includes a hydrocarbon. In an embodiment, the contamination is disposed on a pattern in an absorber layer of the photomask. In an embodiment, oxygen is supplied to the plasma processing chamber at a flow rate of 10 sccm to 100 sccm. In an embodiment, oxygen is supplied to the plasma processing chamber at a flow rate of 20 sccm to 50 sccm. In an embodiment, the method includes supplying chlorine to the plasma processing chamber at a flow rate of 20 sccm to 100 sccm. In an embodiment, the method includes supplying nitrogen to the plasma processing chamber at a flow rate of 10 sccm to 50 sccm. In an embodiment, hydrogen is supplied to the plasma processing chamber at a flow rate of 20 sccm to 100 sccm. In an embodiment, the method includes supplying helium or argon to the plasma processing chamber at flow rate of 60 sccm to 300 sccm. In an embodiment, a source power of the plasma processing chamber during the plasma processing ranges from 100 W to 1000 W. In an embodiment, the duration of the plasma processing ranges from 5 s to 100 s.

Another embodiment of the disclosure is a method, including exposing a photoresist coated substrate to actinic radiation reflected off of a reflective photomask. The reflective photomask is placed in a chamber after using the reflective photomask to expose the photoresist-coated substrate. The reflective photomask is exposed to a plasma in the chamber to remove contamination from a surface of the reflective photomask. The plasma includes oxygen plasma or hydrogen plasma. In an embodiment, exposing a photoresist-coated substrate to actinic radiation comprises performing a plurality of photoresist exposures to actinic radiation. In an embodiment, the plurality of photoresist exposures ranges from 100 to 2500. In an embodiment, the actinic radiation is extreme ultraviolet radiation. In an embodiment, the plasma further comprises chlorine, nitrogen, helium, argon, or combinations thereof.

Another embodiment of the disclosure is a method of reducing white spot defects and critical dimension uniformity drift, including exposing a photoresist coated substrate to actinic radiation reflected off of a reflective photomask, or storing the reflective photomask for a period of time without using the reflective photomask in a photolithographic operation. The reflective photomask is placed in a chamber after using the reflective photomask to expose the photoresist-coated substrate or after the period of time. After placing the reflective photomask in the chamber, a carbon-based residue contamination is removed from a surface of the reflective photomask using a plasma. In an embodiment, the plasma comprises oxygen, hydrogen, argon, helium, chlorine, or nitrogen. In an embodiment, exposing a photoresist-coated substrate to actinic radiation comprises performing a plurality of photoresist exposures to actinic radiation. In an embodiment, the plurality of photoresist exposures ranges from 100 to 2500. In an embodiment, the period of time is at least 30 days. In an embodiment, the period of time is 30 days to 180 days. In an embodiment, the actinic radiation is extreme ultraviolet radiation. In an embodiment, the method includes inspecting the reflective photomask to determine whether the carbon-based residue contamination is removed.

Another embodiment of the disclosure is a method, including determining whether a surface of a photomask is contaminated with a carbon-based residue. The photomask is place in a chamber when it is determined the surface of the photomask is contaminated with the carbon-based residue. The photomask is exposed to a plasma in the chamber to remove the carbon-based residue. The photomask is inspected to determine if the carbon-based residue is removed after exposing the photomask to the plasma. In an embodiment, the method includes using the photomask to expose a photoresist-coated substrate to extreme ultraviolet radiation after determining the carbon-based residue is removed. In an embodiment, the plasma includes oxygen plasma or hydrogen plasma. In an embodiment, the chamber is maintained at a pressure of 1 mtorr to 5 mtorr during the exposing the photomask to a plasma. In an embodiment, the method includes supplying chlorine, nitrogen, helium, or argon to the chamber during the exposing the photomask to a plasma. In an embodiment, the plasma is applied to the photomask at a power ranging from 100 W to 1000 W. In an embodiment, the plasma is applied to the photomask for a duration time ranging from 5 s to 100 s.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   exposing a photoresist coated substrate to radiation reflected off of a reflective photomask, or storing the reflective photomask for a period of time without using the reflective photomask in a photolithographic operation,
   wherein contamination forms on a surface of the reflective photomask during the exposing or storing;
   placing the reflective photomask having contamination on a surface thereof in a plasma processing chamber after using the reflective photomask to expose the photoresist coated substrate or after the period of time; and
   plasma processing the reflective photomask having the contamination in the plasma processing chamber to remove the contamination from the surface,
   wherein the plasma includes oxygen plasma or hydrogen plasma.

2. The method according to claim 1, wherein the plasma processing chamber is maintained at a pressure of 1 mtorr to 5 mtorr during the plasma processing.

3. The method according to claim 1, wherein the contamination is disposed on a pattern in an absorber layer of the photomask.

4. The method according to claim 1, wherein oxygen is supplied to the plasma processing chamber at a flow rate of 10 sccm to 100 sccm.

5. The method according to claim 1, further comprising supplying chlorine to the plasma processing chamber at a flow rate of 20 sccm to 100 sccm.

6. The method according to claim 1, further comprising supplying nitrogen to the plasma processing chamber at a flow rate of 10 sccm to 50 sccm.

7. The method according to claim 1, wherein hydrogen is supplied to the plasma processing chamber at a flow rate of 20 sccm to 100 sccm.

8. The method according to claim 1, further comprising supplying helium or argon to the plasma processing chamber at flow rate of 60 sccm to 300 sccm.

9. The method according to claim 1, wherein the source power of the plasma processing chamber during the plasma processing ranges from 100 W to 1000 W.

10. The method according to claim 1, wherein the duration of the plasma processing ranges from 5 s to 100 s.

11. A method, comprising,
    forming a photomask;
    using the photomask in a photolithographic process to form a photoresist pattern on a substrate; and
    plasma processing the photomask in a plasma processing chamber after using the photomask in a photolithographic process to remove contamination from a surface of the photomask,
    wherein the plasma includes oxygen plasma or hydrogen plasma.

12. The method according to claim 11, wherein the forming a photomask includes operations of:
    forming a Mo/Si multilayer over a substrate;
    forming a capping layer over the Mo/Si multilayer;
    forming an absorber layer over the capping layer;
    forming a hard mask layer over the absorber layer; and
    forming a first photoresist layer over the hard mask layer.

13. The method according to claim 12, further comprising:
    patterning the first photoresist layer to expose a portion of the hard mask layer;
    etching the exposed portion of the hard mask layer to expose a portion of the absorber layer;
    etching the exposed portion of the absorber layer to expose a portion of the capping layer; and
    removing the hard mask layer to expose an upper surface of the absorber layer.

14. The method according to claim 11, wherein the plasma processing chamber is maintained at a pressure of 1 mtorr to 5 mtorr during the plasma processing.

15. The method according to claim 11, wherein oxygen is supplied to the plasma processing chamber at a flow rate of 10 sccm to 100 sccm.

16. The method according to claim 11, further comprising supplying chlorine to the plasma processing chamber at a flow rate of 20 sccm to 100 sccm, or supplying nitrogen to the plasma processing chamber at a flow rate of 10 sccm to 50 sccm.

17. The method according to claim 11, wherein hydrogen is supplied to the plasma processing chamber at a flow rate of 20 sccm to 100 sccm.

18. The method according to claim 11, further comprising supplying helium or argon to the plasma processing chamber at flow rate of 60 sccm to 300 sccm.

19. The method according to claim 11, wherein the source power of the plasma processing chamber during the plasma processing ranges from 100 W to 1000 W.

20. A method, comprising,
    forming a photomask;
    storing the photomask in a photomask pod; and plasma processing the photomask in a plasma processing chamber after storing the photomask in the photomask pod to remove contamination from a surface of the photomask, wherein the plasma includes oxygen plasma or hydrogen plasma.

* * * * *